(12) United States Patent
Baek et al.

(10) Patent No.: US 12,315,792 B2
(45) Date of Patent: May 27, 2025

(54) SEMICONDUCTOR DEVICE

(71) Applicant: Samsung Electronics Co., Ltd., Suwon-si (KR)

(72) Inventors: Jongmin Baek, Seoul (KR); Junghoo Shin, Seoul (KR); Sangshin Jang, Seoul (KR); Junghwan Chun, Anyang-si (KR); Kyeongbeom Park, Suwon-si (KR); Suhyun Bark, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 540 days.

(21) Appl. No.: 17/699,496

(22) Filed: Mar. 21, 2022

(65) Prior Publication Data

US 2023/0027640 A1 Jan. 26, 2023

(30) Foreign Application Priority Data

Jul. 21, 2021 (KR) ........................ 10-2021-0095905

(51) Int. Cl.
| | | |
|---|---|---|
| H01L 23/522 | (2006.01) | |
| H01L 21/768 | (2006.01) | |
| H01L 23/532 | (2006.01) | |

(52) U.S. Cl.
CPC .... *H01L 23/5226* (2013.01); *H01L 21/76829* (2013.01); *H01L 23/53209* (2013.01); *H01L 23/53238* (2013.01); *H01L 23/53266* (2013.01); *H01L 23/53295* (2013.01)

(58) Field of Classification Search
None
See application file for complete search history.

(56) References Cited

U.S. PATENT DOCUMENTS

| | | | |
|---|---|---|---|
| 7,271,091 B2 | 9/2007 | Lee | |
| 7,994,047 B1 | 8/2011 | Woo et al. | |
| 9,040,414 B2 | 5/2015 | Lee | |
| 10,395,984 B2 | 8/2019 | Backes et al. | |
| 10,755,976 B2 | 8/2020 | Cheng et al. | |
| 2004/0002212 A1 | 1/2004 | Choi | |
| 2021/0090950 A1 | 3/2021 | Fan et al. | |
| 2022/0223526 A1* | 7/2022 | Min | .................. H01L 21/76834 |

FOREIGN PATENT DOCUMENTS

| | | |
|---|---|---|
| KR | 10-2004-0001989 A | 1/2004 |
| KR | 100539221 B1 | 12/2005 |

* cited by examiner

*Primary Examiner* — Kyoung Lee
(74) *Attorney, Agent, or Firm* — Harness, Dickey & Pierce, P.L.C.

(57) ABSTRACT

A semiconductor device includes a substrate having an active region, a first insulating layer on the substrate, a second insulating layer on the first insulating layer, an etch stop layer between the first insulating layer and the second insulating layer, a via contact in the first insulating layer and electrically connected to the active region, an interconnection electrode in the second insulating layer and electrically connected to the via contact, a conductive barrier layer on a side surface and a lower surface of the interconnection electrode and having an extension portion extending to a partial region of a side surface of the via contact, and a side insulating layer on a side region of the via contact below the extension portion of the conductive barrier layer, the side insulating layer including the same material as a material of the etch stop layer.

20 Claims, 17 Drawing Sheets

SEMICONDUCTOR DEVICE

CROSS-REFERENCE TO RELATED APPLICATION(S)

This application claims the benefit under 35 USC 119(a) of Korean Patent Application No. 10-2021-0095905 filed on Jul. 21, 2021, in the Korean Intellectual Property Office, the entire disclosure of which is incorporated herein by reference for all purposes.

BACKGROUND

The present inventive concepts relate to a semiconductor device.

In various semiconductor devices, such as logic circuits and memories, interconnection structures (e.g., Back End of Lines (BEOLs)) connecting various conductive elements located on different levels, such as contact plugs connected to conductive lines of a back end of line (BEOL) or connected to active regions such as source and drain, may be used.

In recent years, with increasingly high integration of semiconductor devices, an interconnection area (or contact area) may not be sufficiently secured while line width and/or pitch may be decreased, and thus, contact resistance may increase. In detail, among the processes of forming the interconnection structure, the single damascene process may have a problem in contact resistance as a barrier layer is added between a via contact and an interconnection line, unlike the dual damascene process.

SUMMARY

Example embodiments provide a semiconductor device having a more reliable metal wiring.

According to example embodiments, a semiconductor device includes a substrate having an active region; a first insulating layer on the substrate; a second insulating layer on the first insulating layer; an etch stop layer between the first insulating layer and the second insulating layer; a via contact in the first insulating layer and electrically connected to the active region; an interconnection electrode in the second insulating layer and electrically connected to the via contact; a conductive barrier layer on a side surface and a lower surface of the interconnection electrode and having an extension portion extending to a partial region of a side surface of the via contact; and a side insulating layer on a side region of the via contact below the extension portion of the conductive barrier layer, the side insulating layer including the same material as a material of the etch stop layer.

According to example embodiments, a semiconductor device includes a substrate; a first insulating layer on the substrate; a second insulating layer on the first insulating layer; an etch stop layer between the first insulating layer and the second insulating layer; a via contact in the first insulating layer; an interconnection electrode in the second insulating layer and connected to the via contact; and a conductive barrier layer on a side surface and a lower surface of the interconnection electrode. The conductive barrier layer has a contact expansion element extending to a side surface of the via contact and enclosing an upper region of the via contact, and the interconnection electrode does not overlap the side surface of the via contact in a direction horizontal to an upper surface of the substrate.

According to example embodiments, a semiconductor device includes a substrate; a first insulating layer on the substrate; a second insulating layer on the first insulating layer; a via contact in the first insulating layer; an interconnection electrode in the second insulating layer and connected to the via contact; and a conductive barrier layer on a side surface and a lower surface of the interconnection electrode. The first insulating layer has a damaged region in contact with a side surface of a lower region of the via contact and having a carbon content less than a carbon content of other regions of the first insulating layer, and the conductive barrier layer has a contact expansion element extending to a side surface of the via contact and contacting a side surface of an upper region of the via contact.

According to example embodiments, a method of manufacturing a semiconductor device includes forming a first insulating layer on a substrate; forming a via hole in the first insulating layer, the first insulating layer having a damaged region in a region exposed by the via hole; forming a via contact by filling the via hole with a first conductive material; forming a recess along a side surface of the via contact by removing the damaged region after forming the via contact; forming an etch stop layer on the first insulating layer, the etch stop layer having a side insulating portion filling the recess; forming a second insulating layer on the etch stop layer; forming a trench in the second insulating layer to be located on the via contact, using the etch stop layer; removing at least a portion of the etch stop layer exposed by the trench and at least a portion of the side insulating portion; forming a conductive barrier layer in the trench, the conductive barrier layer having a contact expansion element filling a space from which the side insulating portion has been removed; and forming an interconnection electrode by filling a second conductive material on the conductive barrier layer in the trench.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, example embodiments will be described with reference to the accompanying drawings.

Figure 1:
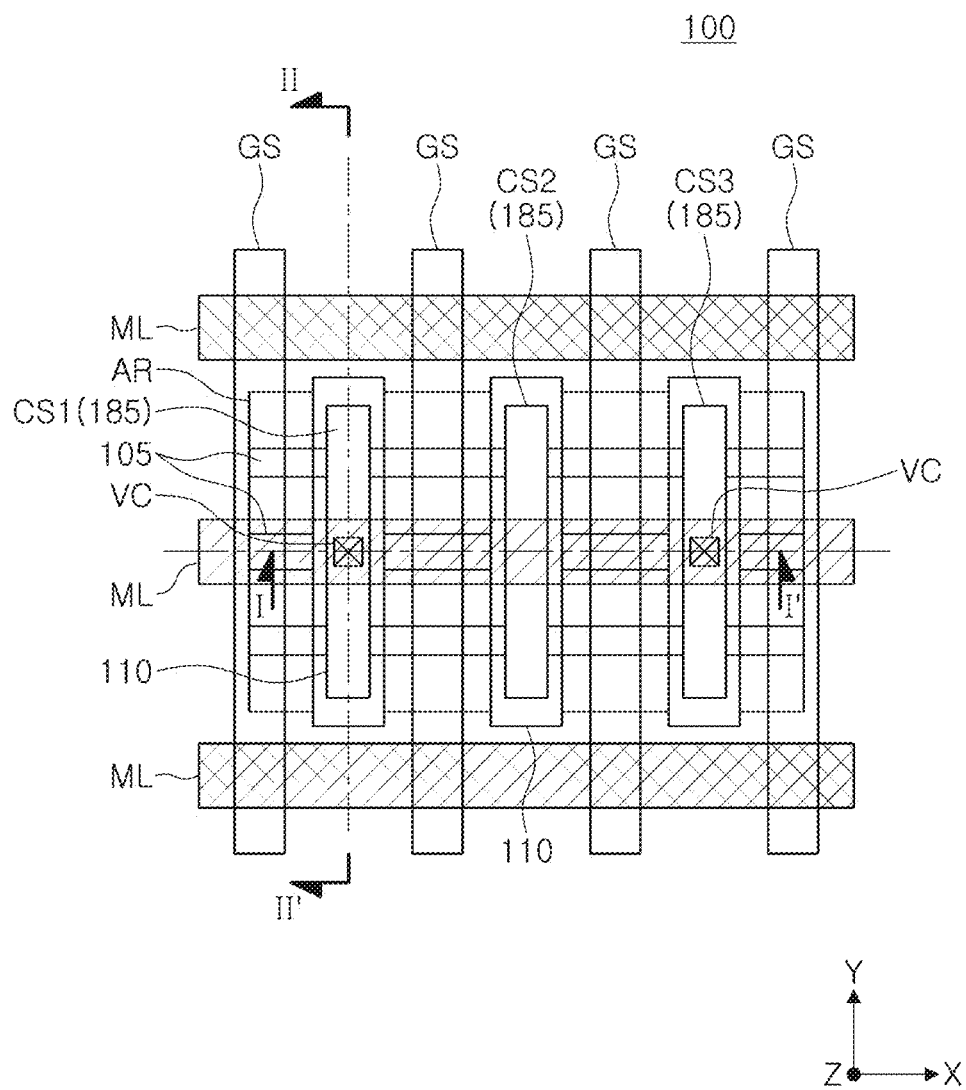
FIG. 1 is a plan view illustrating a semiconductor device according to example embodiments.
Figure 2:
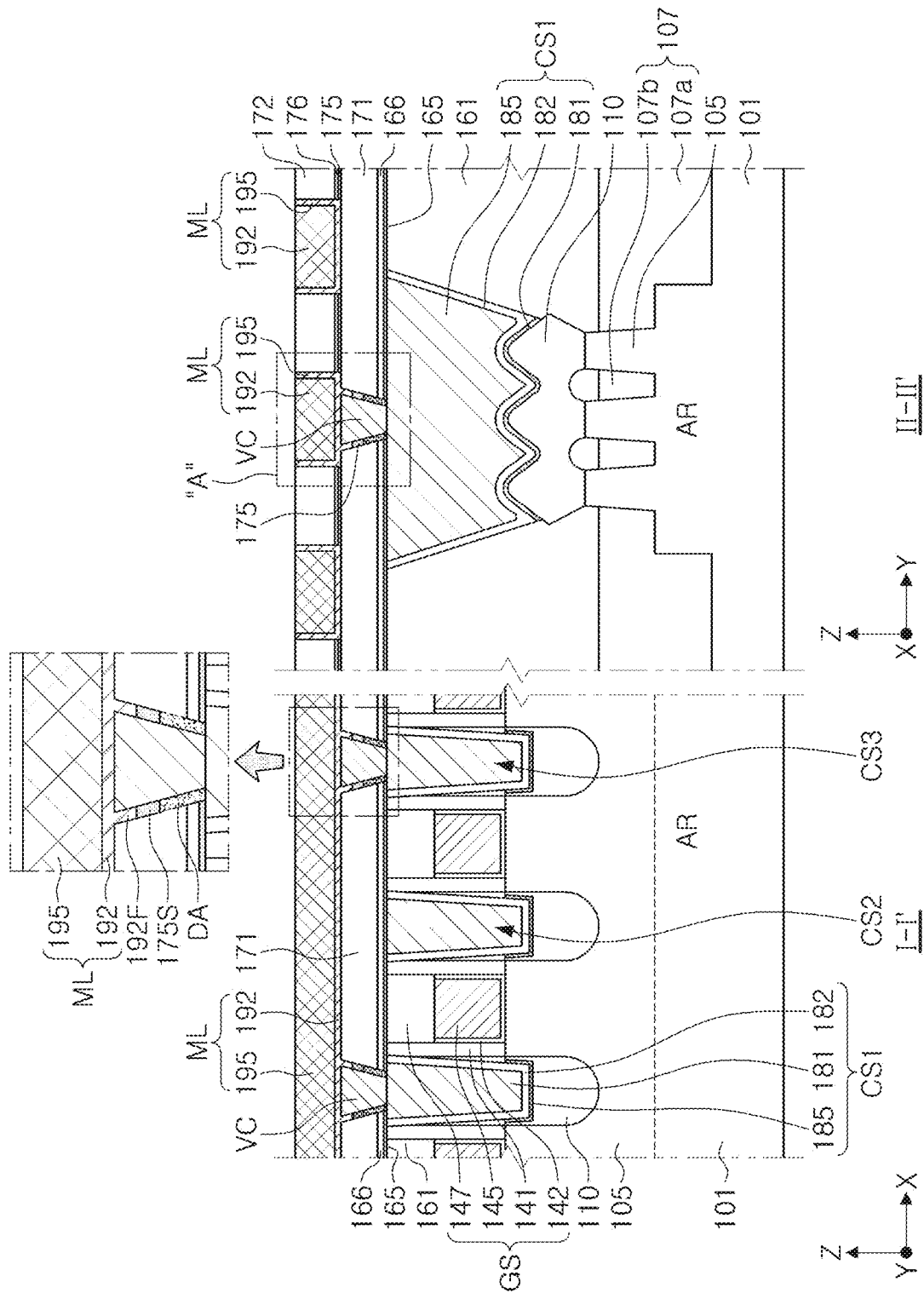
FIG. 2 is a cross-sectional view of the semiconductor device illustrated in FIG. 1 taken along lines I-I' and II-II'.

FIG. 1 is a plan view illustrating a semiconductor device according to example embodiments, and FIG. 2 is a cross-sectional view of the semiconductor device illustrated in FIG. 1 taken along lines I-I' and II-II'.

Referring to FIGS. 1 and 2, a semiconductor device 100 according to example embodiments includes an active region AR disposed on a substrate 101, a plurality of active fins 105 extending in a first direction (e.g., X direction) on the active region AR, and a plurality of gate structures GS intersecting the plurality of active fins 105, on the substrate 101, and extending in a second direction (e.g., Y direction) perpendicular to the first direction.

The substrate 101 may include, for example, a semiconductor such as Si or Ge, or a compound semiconductor such as SiGe, SiC, GaAs, InAs, or InP. In other example embodiments, the substrate 101 may have a silicon-on-insulator (SOI) structure. The active region AR may be a conductive region such as a well doped with an impurity or a structure doped with an impurity. For example, the active region AR may have an n-type well for a PMOS transistor or a p-type well for an NMOS transistor.

Each of the plurality of active fins 105 has a structure protruding upwardly (e.g., in the Z direction) from the upper surface of the active region AR. As illustrated in FIG. 1, the plurality of active fins 105 may be arranged side by side in the second direction in the active region AR. The active fins 105 may serve as a channel region of the transistor. In example embodiments, the active fins 105 are exemplified as being provided by three, but the present inventive concepts are not limited thereto. For example, the active fins 105 may be provided singly or in another plurality.

A device isolation layer 107 defines the active region AR. The device isolation layer 107 may include silicon oxide or a silicon oxide-based insulating material. The device isolation layer 107 may include a first isolation region 107a defining the active region AR, and a second isolation region 107b defining the active fin 105. The first isolation region 107a may have a bottom surface that is deeper than that of the second isolation region 107b. For example, the first isolation region 107a may be referred to as deep trench isolation (DTI), and the second isolation region 107b may be referred to as shallow trench isolation (STI). The second isolation region 107b may be disposed on the active region AR. As described above, the active fin 105 may pass through the second isolation region 107b in such a manner that a portion thereof protrudes from an upper portion of the second isolation region 107b.

The semiconductor device 100 according to example embodiments may include a gate structure GS. As illustrated in FIG. 1, the gate structure GS may have a line shape extending in the second direction (Y-direction). The gate structure GS may overlap a portion of each of the active fins 105. The gate structure GS may include gate spacers 141, a gate dielectric layer 142 and a gate electrode 145 sequentially disposed between the gate spacers 141, and a gate capping layer 147 disposed on the gate electrode 145.

The semiconductor device 100 according to example embodiments may include a source/drain region 110, and first to third contact structures CS1, CS2, and CS3 connected to the source/drain region 110. The source/drain regions 110 may be formed in some regions of the active fins 105 positioned on both sides of the gate structure GS.

In some example embodiments, the source/drain region 110 may include forming a recess in a partial region of the active fin 105 and performing selective epitaxial growth (SEG) in the recess. The source/drain region 110 may include Si, SiGe, or Ge, and depending on the N-type or P-type transistor, the source/drain region 110 may have a different material or a different shape. For example, in example embodiments of a PMOS transistor, the source/drain region 110 may include silicon-germanium (SiGe) and may be doped with P-type impurities, for example, boron (B), indium (In), or gallium (Ga). A cross section (e.g., in Y-Z directions) of the source/drain region 110 may have a pentagonal shape. In example embodiments of an NMOS transistor, the source/drain region 110 includes silicon and may be doped with N-type impurities, for example, phosphorus (P), nitrogen (N), arsenic (As), or antimony (Sb). A cross section (e.g., Y-Z) of the source/drain region 110 may have a hexagonal shape or a polygonal shape having a gentle angle. In this manner, the active fins 105 may constitute a transistor together with the gate structure GS and the source/drain region 110.

In the semiconductor device 100 according to example embodiments, an interlayer insulating layer 161 may be disposed on the device isolation layer 107. The interlayer insulating layer 161 may be disposed around the gate structure GS. For example, the interlayer insulating layer 161 may include Flowable Oxide (FOX), Tonen SilaZen (TOSZ), Undoped Silica Glass (USG), Borosilica Glass (BSG), Phosphosilaca Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable CVD (FCVD) oxide, or combinations thereof. The interlayer insulating layer 161 may be formed using a chemical vapor deposition (CVD) process, a flowable-CVD process, or a spin coating process.

The first to third contact structures CS1, CS2, and CS3 employed in example embodiments may be formed to penetrate through the interlayer insulating layer 161, and may be connected to the source/drain regions 110, respectively.

As illustrated in FIG. 1, the first to third contact structures CS1, CS2, and CS3 may each include a metal-silicide layer 182, a conductive barrier 181, and a contact plug 185. The conductive barrier 181 may cover side surfaces and a lower surface of the contact plug 185. The metal silicide layer 182 may be disposed between the conductive barrier 181 and the source/drain regions 110. For example, the conductive barrier 181 may include Ta, TaN, Mn, MnN, WN, Ti, or TiN. The metal silicide layer 182 may include CoSi, NiSi, or TiSi. The contact plug 185 may include tungsten (W), cobalt (Co), titanium (Ti), alloys thereof, or combinations thereof.

The semiconductor device 100 according to example embodiments includes an interconnection structure connected to the first to third contact structures CS1 to CS3. The interconnection structure employed in some example embodiments includes via contacts VC connected to the first and third contact structures CS1 and CS3, respectively, and interconnection lines ML connected to the via contacts VC. As illustrated in FIG. 1, three interconnection lines ML according to example embodiments each extend in the first direction (e.g., X-direction) and may be arranged in the second direction (e.g., Y-direction).

A first etch stop layer 165 and a first insulating protective layer 166 may be sequentially formed on the interlayer insulating layer 161 surrounding the first to third contact structures CS1, CS2, and CS3. The first etch stop layer 165 may be used as an etch stop element for forming a via contact VC, and the first insulating protective layer 166 may be used as a barrier structure together with the etch stop element. In some example embodiments, the first etch stop layer 165 may be a compound containing an aluminum element. For example, the first etch stop layer 165 may include aluminum nitride (An), aluminum oxynitride (AlON), aluminum oxide (AlO), or aluminum oxide carbide (AlOC). For example, the first insulating protective layer 166 may include silicon nitride, silicon carbide, silicon oxynitride, or silicon carbonitride.

Referring to FIG. 2, a first insulating layer 171 and a second insulating layer 172 may be sequentially disposed on the first insulating protective layer 166. A second etch stop layer 175 and a second insulating protective layer 176 may be sequentially disposed between the first and second insulating layers 171 and 172. The second etch stop layer 175 may be used as an etch stop element for forming the interconnection line ML. In some example embodiments, the second etch stop layer 175 and the second insulating protective layer 176 may be formed of the same or similar material to the first etch stop layer 165 and the first insulating protective layer 166, respectively. For example, the second etch stop layer 175 may include aluminum nitride (AlN), aluminum oxynitride (AlON), aluminum oxide (AlO), or aluminum oxide carbide (AlOC). For example, the second insulating protective layer 176 may include silicon nitride, silicon carbide, silicon oxynitride, or silicon carbonitride.

The first and second insulating layers 171 and 172 may include a material having a low dielectric constant (e.g., 3.3 or less). In some example embodiments, the first and second insulating layers 171 and 172 may include the same or similar material as the interlayer insulating layer 161. For example, the first and second insulating layers 171 and 172 may include fluorine-doped silicon oxide such as SiOF, carbon-doped silicon oxide such as SiOCH, porous silicon oxide, an inorganic polymer such as Hydrogen Silsesquioxane (HSSQ), Methyl Silsesquioxane (MSSQ), or the like, or a spin-on organic polymer. For example, the first and second insulating layers 171 and 172 may be formed using a chemical vapor deposition (CVD) process, a flowable-CVD process, or a spin coating process.

Figure 3:
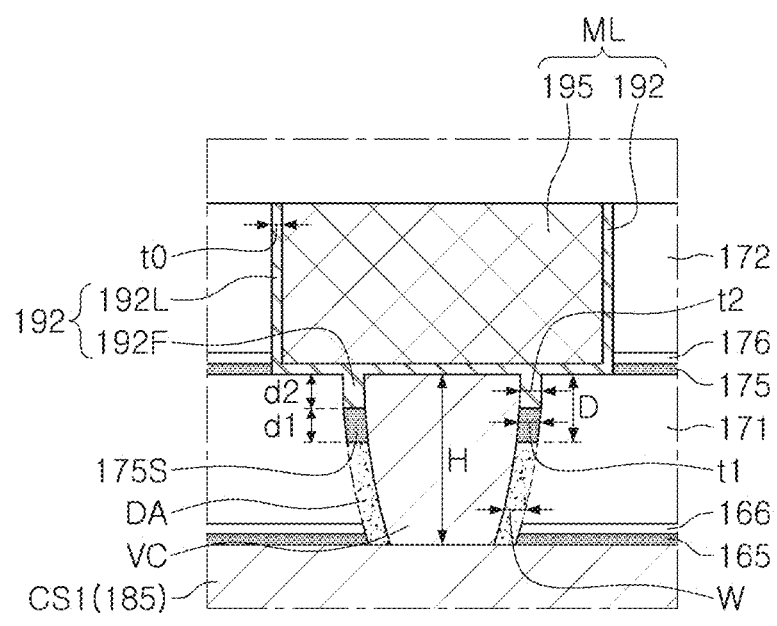
FIG. 3 is an enlarged partial cross-sectional view of portion "A" of the semiconductor device illustrated in FIG. 2.

FIG. 3 is an enlarged partial cross-sectional view of the semiconductor device illustrated in FIG. 2.

Referring to FIG. 3 together with FIG. 2, in example embodiments, the interconnection structure may include the via contacts VC connected to the first and third contact structures CS1 and CS3, respectively, and the interconnection lines ML connected to the via contacts VC. For example, the interconnection structure according to example embodiments may be formed by a single damascene process, in which the via contacts VC and the interconnection lines ML are respectively formed by separate processes (refer to FIGS. 4A to 4E).

The via contacts VC may be disposed in the first insulating layer 171, and may be connected to the first and third contact structures CS1 and CS3, respectively, to be electrically connected to the active elements (e.g., active fins, source/drain, and gate electrodes).

The interconnection lines ML may be disposed in the second insulating layer 172 and may be configured to be electrically connected to the via contact VC. In detail, each of the interconnection lines ML includes an interconnection electrode 195 positioned in the second insulating layer 172 to be located on the via contact VC, and a conductive barrier layer 192 disposed on a side surface and a lower surface of the interconnection electrode 195.

In example embodiments, as illustrated in FIG. 3, the conductive barrier layer 192 may have an extended portion 192F extending to a partial region of a side surface of the via contact VC. For example, at least one of the via contact VC and the interconnection electrode 195 may include Cu, Co, Mo, Ru, or W. In some example embodiments, the via contact VC may include W, and the interconnection electrode 195 may include Cu. For example, the conductive barrier layer 192 may include Ta, TaN, Mn, MnN, WN, Ti, or TiN.

In example embodiments, since the conductive barrier layer 192 has a portion positioned between the interconnection electrode 195 and the via contact VC, the contact resistance between the via contact VC and the interconnection electrode 195 may be increased by the conductive barrier layer 192, but in example embodiments, since the contact area with the via contact VC is expanded by the extended portion 192F of the conductive barrier layer 192, the actual contact resistance may be greatly reduced. In this respect, the extended portion 192F of the conductive barrier layer 192 is referred to as a "contact expansion element." Although not limited, a length da of the extended portion 192F of the conductive barrier layer 192 may be in the range of 5% to 40% of a total height H of the via contact VC. For example, a length d2 of the extended portion 192F may be in the range of 3 nm to 20 nm, and in a specific instance, may be in the range of 5 nm to 15 nm.

In example embodiments, the conductive barrier layer 192 has the extended portion 192F extending along the side surface of the upper region of the via contact VC, while the interconnection electrode 195 does not extend to the side surface of the upper region of the via contact VC. For example, unlike the extended portion 192F, the interconnection electrode 195 may not have a region overlapping the via contact VC in a direction horizontal to the upper surface of the substrate.

As illustrated in FIG. 3, a side insulating layer 175S may be disposed on the side area of the via contact VC below the extended portion 192F of the conductive barrier layer 192. The side insulating layer 175S may include the same material as the second etch stop layer 175. In some example embodiments, the side insulating layer 175S may include an aluminum-containing compound. For example, the side insulating layer 175S may include aluminum nitride (AlN), aluminum oxynitride (AlON), aluminum oxide (AlO), or aluminum oxide carbide (AlOC). Although not particularly limited, a length db of the side insulating layer 171S may be 30% or less of the total height H of the via contact VC. For example, a length d1 of the side insulating layer 175S may be 10 nm or less. In some example embodiments, the side insulating layer 175S may not be present (refer to FIGS. 8 and 9).

In this specification, it may be understood that the "length" of each of the extended portion 192F and the side insulating layer 175S is a height defined in a direction (e.g., Z direction) perpendicular to the upper surface of the substrate 101 as illustrated in FIG. 3. A sum D of the lengths of the extended portion 192F and the side insulating layer 175S may be in the range of 5% to 60% of the height H of the via contact VC, and in a specific example, may range from 10% to 50%, but is not limited thereto.

In addition, the first insulating layer 171 may include a damaged region DA in contact with a side area of the via contact VC below the side insulating layer 175S. The damaged region DA may be a damaged region in the process (refer to FIG. 4A) of forming a via hole VH for the via contact VC in the first insulating layer 171. The damaged region DA may have a carbon content lower than that of other regions of the first insulating layer 171 and/or have an oxygen content higher than that of other regions of the first insulating layer 171. For example, this component analysis may be performed by Secondary Ion Mass Spectrometry (SIMS). In some example embodiments, the first insulating layer 171 may include SiOC or SiCOH, and the damaged region DA may include silicon oxide ($SiO_x$).

A width W of the damaged region DA may be 10 nm or less, and in some example embodiments, may be in the range of 2 nm to 5 nm. A thickness to of the side insulating layer 175S and a thickness tb of the extended portion 192F may be similar to a width W of the damaged region DA. The thickness tb of the extended portion 192F may be different from (e.g., may be less than) a thickness t0 of another region 192L of the conductive barrier layer 192, for example, of a region located on the side and lower surfaces of the interconnection electrode 195. For example, the thickness t0 of the other region 192L of the conductive barrier layer 192 may be in the range of 1 nm to 3 nm.

In example embodiments, the expansion of the contact area using the conductive barrier layer 192 may be implemented by partially recessing the damaged region DA of the first insulating layer 171 adjacent to the side surface of the via contact VC. The contact area of the via contact VC and the interconnection line ML may be increased by filling the recessed space adjacent to the side surface of the via contact VC with the conductive barrier layer 192 material to form a contact expansion element 192F, thereby significantly reducing the contact resistance.

FIGS. 4A to 4E are cross-sectional views for respective main processes, illustrating a method of manufacturing a semiconductor device according to example embodiments.

Figure 4:
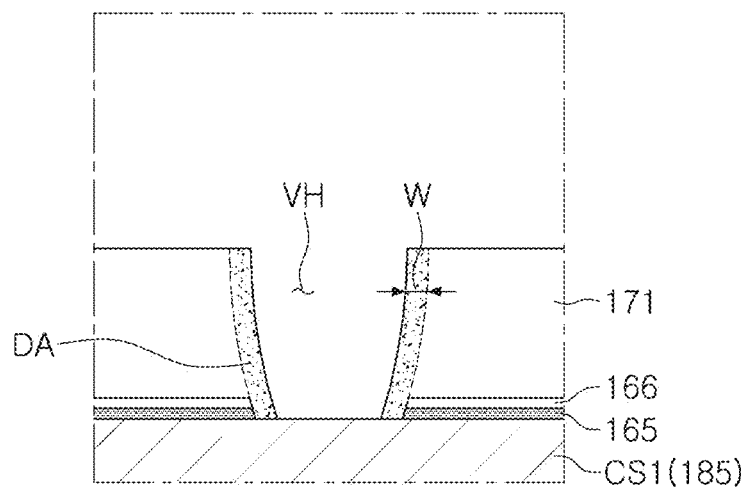
FIGS. 4A to 4E are cross-sectional views for respective main processes illustrating a method of manufacturing a semiconductor device according to example embodiments.
Figure 4:
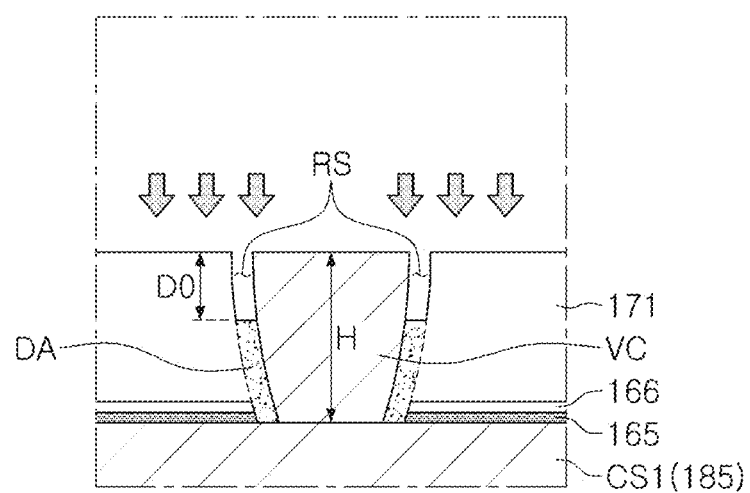

First, referring to FIG. 4A, the first insulating layer 171 is formed on the first contact structure CS1 and the interlayer insulating layer 161, and a via hole VH is formed in the first insulating layer 171.

In example embodiments, the first etch stop layer 165 and the first insulating protective layer 166 may be formed on the first contact structure CS1 and the interlayer insulating layer 161, and the first insulating layer 171 may be formed on the first insulating protective layer 166. The via hole VH connected to a region of the first contact structure CS1 may be formed in the first insulating layer 171, using the first etch stop layer 165. In this etching process, the damaged region DA may be provided in an area of the first insulating layer 171, exposed by the via hole VH. The damaged region DA may have a carbon content lower than that of other regions of the first insulating layer 171 and/or may have an oxygen content higher than that of other regions of the first insulating layer 171. In some example embodiments, the first insulating layer 171 may include SiOC or SiCOH, and the damaged region DA may include silicon oxide ($SiO_x$) Although not limited, the width W of the damaged region DA may be 10 nm or less, and in some example embodiments, may be in the range of 2 nm to 5 nm.

Next, referring to FIG. 4B, the via contact VC is formed by filling the via hole VH with a first conductive material, and then, the damaged region DA is removed to form a recess RS along the side surface of the via contact VC.

The via contact VC may be formed by forming a first conductive material on an upper surface of the first insulating layer to fill the via hole, and then planarizing the same using a chemical mechanical polishing (CMP) process. The first conductive material may include Cu, Co, Mo, Ru, or W, and in some example embodiments, may be W. Then, the recess RS may be formed by removing a portion of the damaged region DA together with the removal of the residue after the CMP process using a cleaning process. This cleaning process may be performed as a cleaning process using diluted HF (DHF). A depth D0 of the recess RS may range from 5% to 60% of the height H of the via contact VC, and in a specific example, may range from 10% to 50%. The depth D0 of the recess RS may substantially correspond to the sum of the length d1 of the side insulating layer 175S and the length d2 of the extended portion 192F in the final structure (please refer to FIG. 3).

Figure 4C:
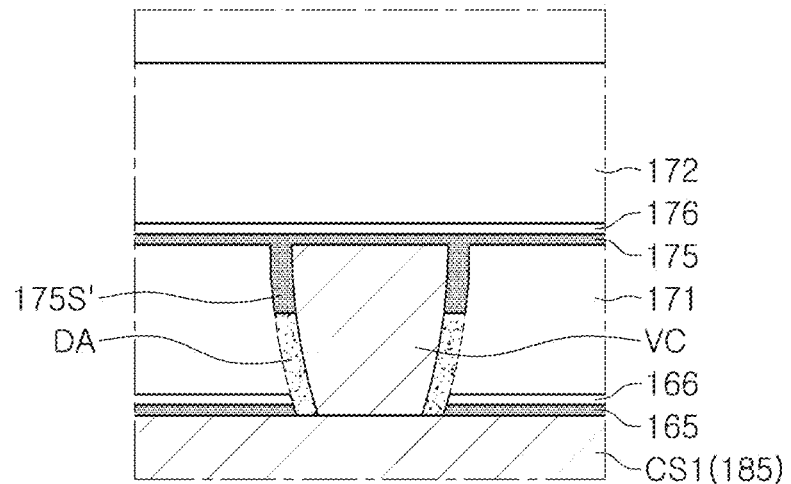

Next, referring to FIG. 4C, the second etch stop layer 175 and the second insulating protective layer 176 may be formed on the first insulating layer 171, and the second insulating layer 172 may be formed on the second insulating protective layer 176.

The second etch stop layer 175 may be filled in the recess RS. In this specification, the filled portion is referred to as a side insulating portion 175S'. The side insulating portion 175S' may be formed on the side surface of the upper region of the via contact VC along the space of the recess RS. In a plan view, the side insulating portion 175S' may surround an upper region of the via contact VC. In some example embodiments, the second etch stop layer 175 may be an aluminum-containing compound, and the second insulating protective layer 176 may be a compound that does not contain an aluminum element. For example, the second etch stop layer 175 may include aluminum nitride (AlN), aluminum oxynitride (AlON), aluminum oxide (AlO), or aluminum oxide carbide (AlOC). The second insulating protective layer 176 may include silicon nitride, silicon carbide, silicon oxynitride, or silicon carbonitride. In some example embodiments, the second etch stop layer 175 or the second insulating protective layer 176 may be omitted (see FIG. 9).

Figure 4D:
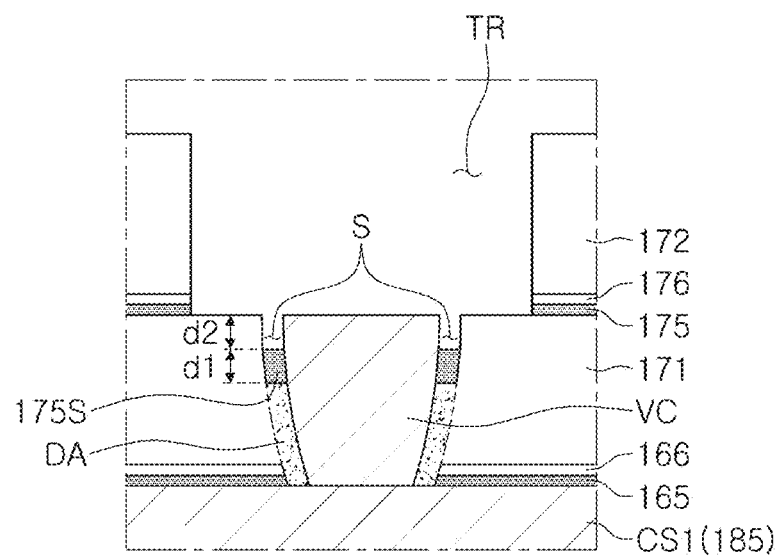

Next, referring to FIG. 4D, a trench TR is formed in the second insulating layer 172, to be positioned on the via contact VC, and a portion of the second etch stop layer 175 exposed by the trench TR and a portion of the side insulating portion 175S' may be removed.

The trench TR for an interconnection line may be formed in the second insulating layer 172 using the second etch stop layer 175. In some example embodiments, the second insulating protective layer 176 may be removed in the trench formation process. Next, the portion of the second etch stop layer 175 exposed by the trench TR is removed. In the process of removing the etch stop layer 175, at least a portion of the side insulating portion 175S' may be removed. After this process, a portion of the side insulating portion 175S may remain. A space S having a predetermined or alternatively, desired depth d2 may be provided on the side insulating portion 175S. In some example embodiments, when the side insulating portion 175S is formed to a relatively low depth (see FIG. 8) or includes a material having a relatively low selectivity with another insulating material layer (see FIG. 9), the side insulating portion 175S may be almost completely removed.

Figure 4E:
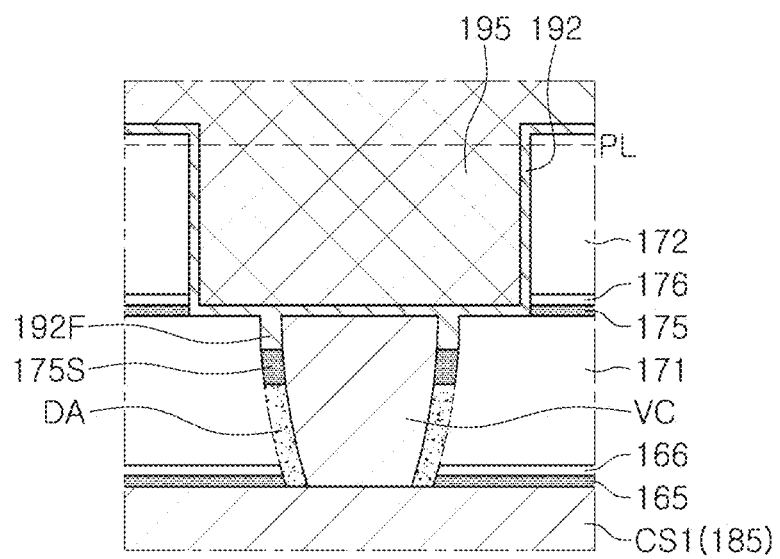

Next, referring to FIG. 4E, the conductive barrier layer 192 is formed in the trench TR, and a second conductive material is filled on the conductive barrier layer 192 in the trench TR to form the interconnection electrode 195.

The conductive barrier layer 192 is filled in the space S from which the side insulating portion 175S has been removed, and the filled part may be provided as the contact expansion element 192F for increasing a contact area with the via contact VC. For example, the conductive barrier layer 192 may include Ta, TaN, Mn, MnN, WN, Ti, or TiN. For example, the interconnection electrode 195 may include Cu, Co, Mo, Ru, or W. In some example embodiments, the interconnection electrode 195 may include Cu. The interconnection structure illustrated in FIG. 3 may be manufactured by performing a CMP process at a constant level PL to be exposed to the upper surface of the second insulating layer 175 in a subsequent process.

Figure 5:
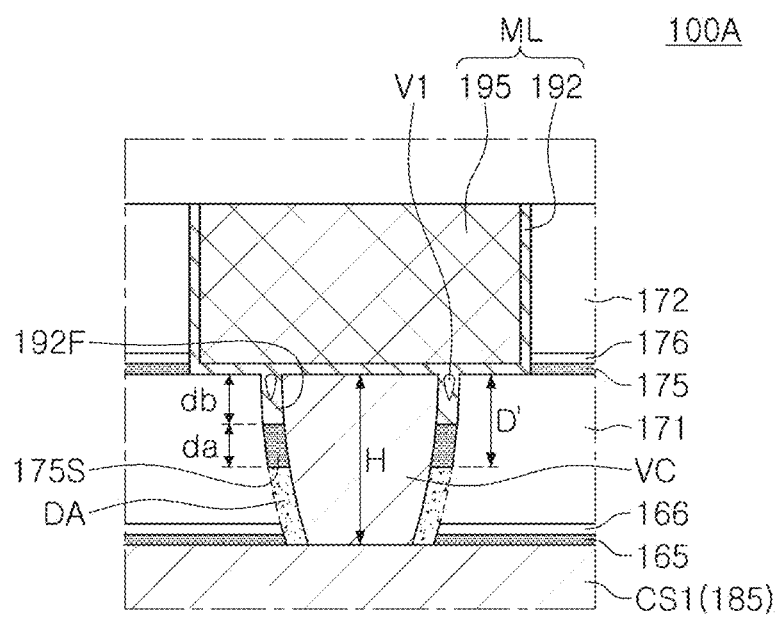
FIG. 5 is a cross-sectional view illustrating a semiconductor device according to example embodiments.

FIG. 5 is a cross-sectional view illustrating a semiconductor device according to example embodiments.

Referring to FIG. 5, it may be understood that a semiconductor device 100A according to example embodiments is similar to that of the example embodiment illustrated in FIGS. 1 to 3, except that a sum D' of lengths of a contact expansion element 192F and a side insulating layer 175S is relatively long and a void V1 is formed in the contact expansion element. In addition, the components of example embodiments may be understood with reference to the descriptions of the same or similar components of example embodiments illustrated in FIGS. 1 to 3, unless otherwise specifically stated.

In some example embodiments, a sum D' of the lengths of the contact expansion element 192F and the side insulating layer 175S may be greater than the sum D of other example embodiments. Also, the contact expansion element 192F may have the void V1. The void V1 is more likely to occur as a length db of the contact expansion element 192F increases or the width of the contact expansion element 192F decreases.

FIGS. 6A to 6D are cross-sectional views for respective main processes illustrating a method of manufacturing the semiconductor device illustrated in FIG. 5.

Figure 6A:
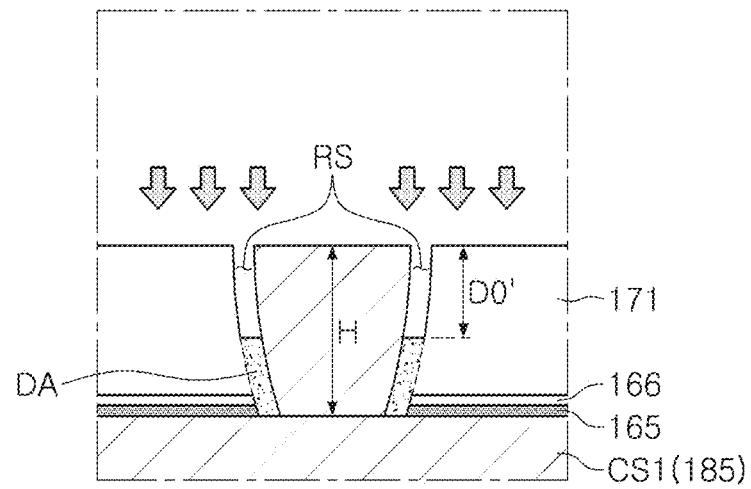
FIGS. 6A to 6D are cross-sectional views for respective main processes to describe a method of manufacturing the semiconductor device illustrated in FIG. 5.

First, referring to FIG. 6A, the process of FIG. 6 may be understood as a process corresponding to that in FIG. 4B. After the via contact VC is formed in the via hole VH, the damaged region DA may be removed to form the recess RS along the side surface of the via contact VC. In this process, a depth D0' of the recess RS may be formed to be greater than the depth D0 of the recess in other example embodiments. The depth D0' of the recess RS may substantially correspond to the sum of the length da of the side insulating layer 175S and the length db of the extended portion 192F in the final structure (refer to FIG. 5).

Figure 6B:
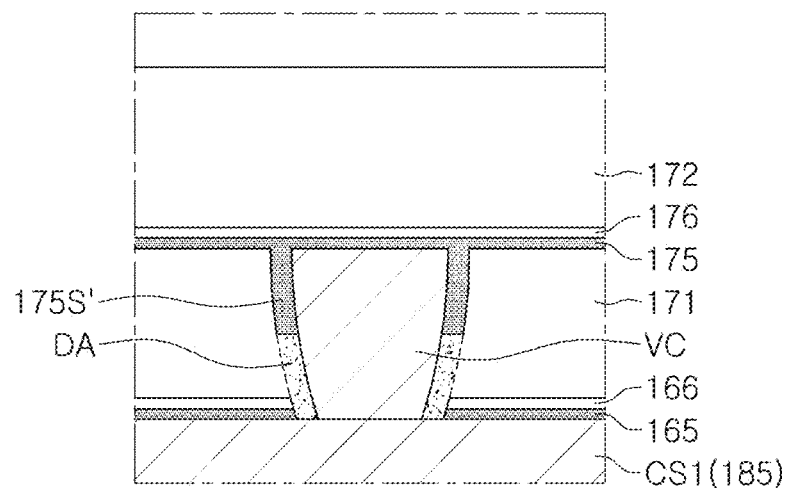

Next, referring to FIG. 6B, a second etch stop layer 175 and a second insulating protective layer 176 may be formed on the first insulating layer 171, and a second insulating layer 172 may be formed on the second insulating protective layer 176. The second etch stop layer 175 may be filled in the recess RS to form a side insulating portion 175S'.

Figure 6C:
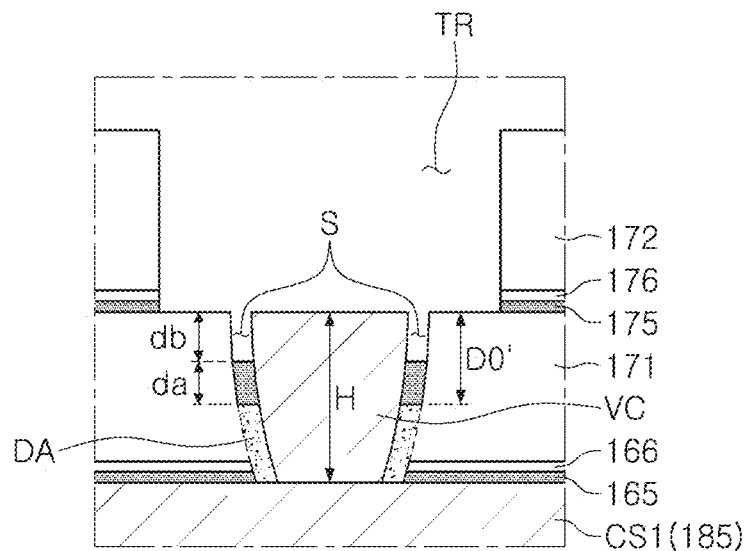

Next, referring to FIG. 6C, a trench TR is formed in the second insulating layer 172, and a portion of the second etch stop layer 175 exposed by the trench TR and a portion of the side insulating portion 175S' may be removed. At least a portion of the side insulating portion 175S' may be removed together with the portion of the second etch stop layer 175 exposed by the trench TR. In this process, a sufficient contact area may be secured on the side surface of the via contact VC by forming a space on the side insulating portion 175S to a sufficient depth db.

Figure 6D:
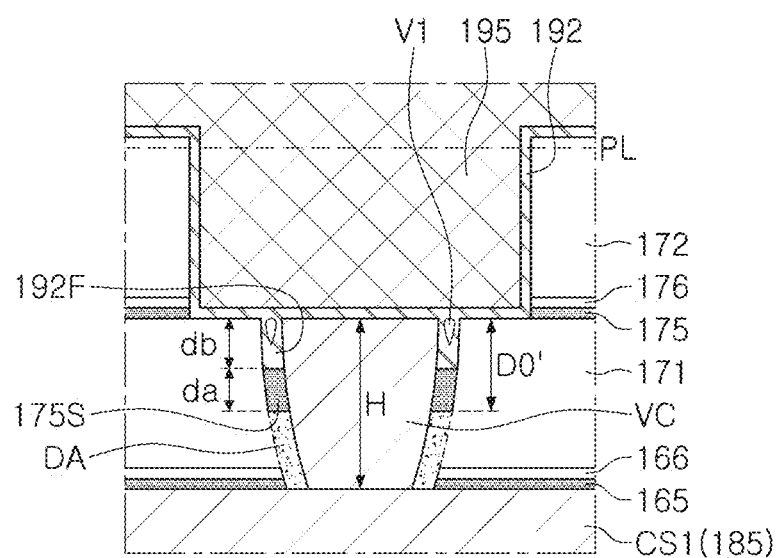

Next, referring to FIG. 6D, a conductive barrier layer 192 may be formed in the trench TR, and a second conductive material is filled on the conductive barrier layer 192 in the trench TR to form an interconnection electrode 195. The contact expansion element sufficiently filled in the space S may sufficiently lower the contact resistance. The interconnection structure illustrated in FIG. 5 may be manufactured by performing a CMP process at a constant level PL to be exposed to the upper surface of the second insulating layer 175 in a subsequent process.

Figure 7:
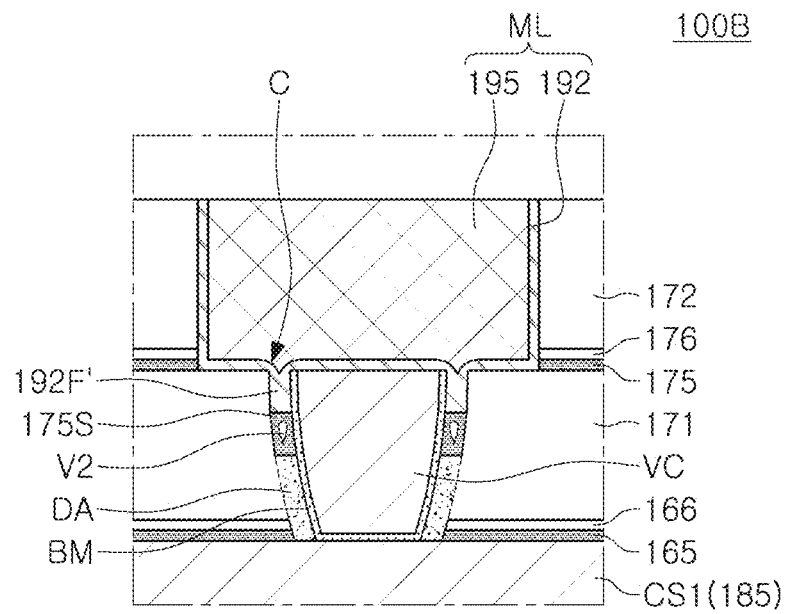
FIGS. 7 to 9 are cross-sectional views illustrating semiconductor devices according to various example embodiments, respectively.
Figure 8:
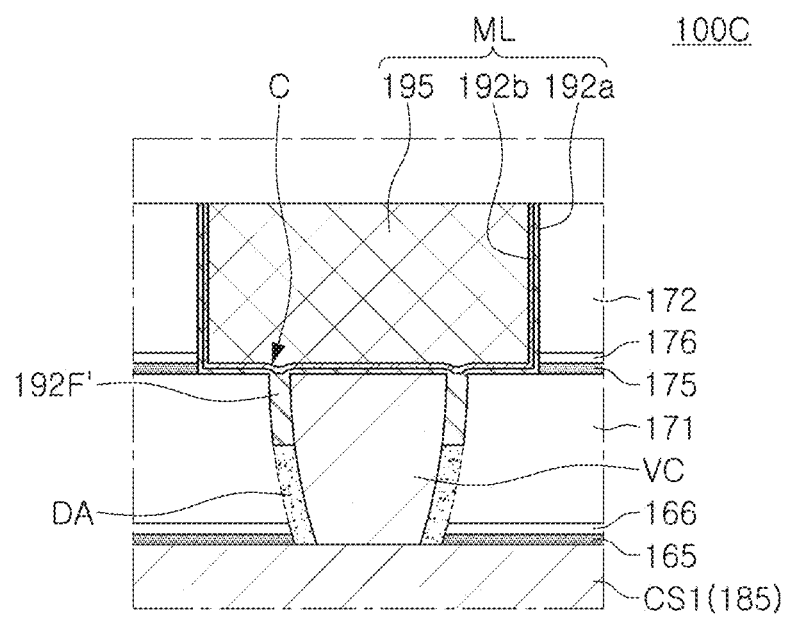
Figure 9:
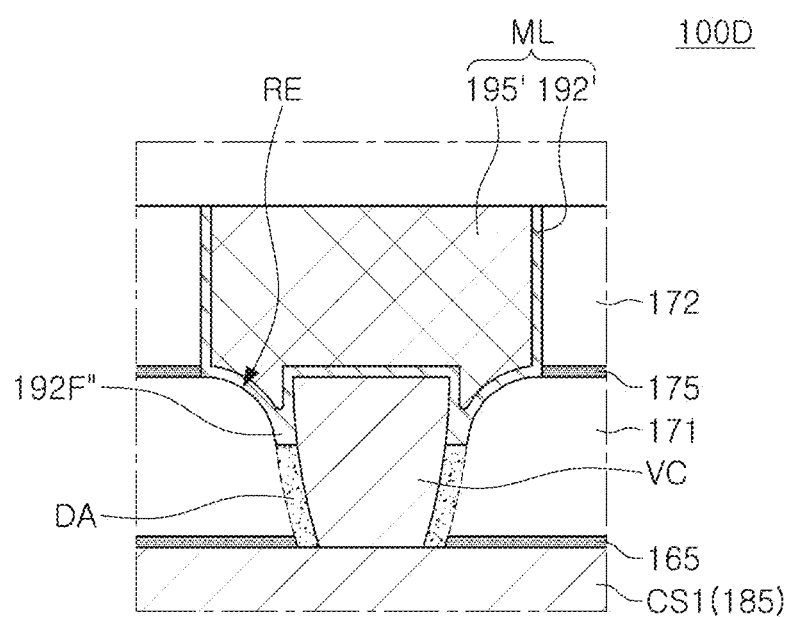

FIGS. 7 to 9 are cross-sectional views illustrating semiconductor devices according to various example embodiments, respectively.

Referring to FIG. 7, a semiconductor device 100B according to an example embodiment may be understood to be similar to that of example embodiments illustrated in FIGS. 1 to 3, except that a concave portion C is formed on the upper surface of a contact expansion element 190F', avoid V2 is formed in a side insulating layer 175S, and a conductive barrier layer BM is also formed on a via contact VC. In addition, the components of example embodiments may be understood with reference to the descriptions of the same or similar components of example embodiments illustrated in FIGS. 1 to 3, unless otherwise specifically stated.

As in some example embodiments, the conductive barrier layer BM may also be formed on the via contact VC. For example, the conductive barrier layer 192 may include Ta, TaN, Mn, MnN, WN, Ti, or TiN. A void V2 may be present in the side insulating layer 175S. The void V2 is more likely to occur as the length of the side insulating layer 175S increases or the width of the side insulating layer 175S decreases. On the other hand, a concave portion C may be formed on the upper surface of the contact expansion element 190F' according to the size of the recess space. The interconnection electrode 195 may have a portion filling the concave portion C.

Referring to FIG. 8, a semiconductor device 100C according to example embodiments may be understood to be similar to that of the example embodiment illustrated in FIGS. 1 to 3, except that a concave portion C is formed on the upper surface of the contact expansion element 190F', an interconnection line ML includes conductive barrier layers 192a and 192b comprised of two layers, and the side insulating layer in contact with the via contact VC is omitted. In addition, the components of example embodiments may be understood with reference to the descriptions of the same or similar components of example embodiments illustrated in FIGS. 1 to 3, unless otherwise specifically stated.

The contact expansion element 190F' employed in example embodiments may have an upper surface having a concave portion C similar to other example embodiments (see FIG. 7). The interconnection line ML may include a plurality of conductive barriers 192a and 192b. The conductive barrier employed in example embodiments may include a first conductive barrier 192a and a second conductive barrier 192b. For example, the first conductive barrier 192a may include a metal nitride such as titanium nitride (TiN) or tantalum nitride (TaN), and the second conductive barrier 192b may include a metal such as cobalt (Co), ruthenium (Ru), or the like.

In the interconnection structure employed in example embodiments, the side insulating layer in contact with the via contact VC may be omitted. In the process illustrated in FIGS. 4C and 4D, when the side insulating portion 175S' is formed to a relatively low depth, the side insulating portion may be almost completely removed. As illustrated in FIG. 8, the contact expansion element 192F' may be disposed to contact the damaged region DA located therebelow. In example embodiments, the contact expansion element 192F' is illustrated to include the same material as that of the first conductive barrier 192a, but in some example embodiments, the contact expansion element 192F' may also have a two-layered structure including a material layer of the first conductive barrier 192a and a material layer of the second conductive barrier 192b.

Referring to FIG. 9, it may be understood that a semiconductor device 100D according to example embodiments is similar to that of example embodiments illustrated in FIGS. 1 to 3, except that first and second insulating barriers 165' and 175' different from the etch stop layers of other example embodiments are included, the region of the first insulating layer 171 around the via contact VC is additionally removed as indicated by RE, and the side insulating layer around the via contact VC is omitted. In addition, the components of example embodiments may be understood with reference to the descriptions of the same or similar components of example embodiments illustrated in FIGS. 1 to 3, unless otherwise specifically stated.

The first and second insulating barriers 165' and 175' employed in example embodiments may have an insulating barrier function for reducing or preventing diffusion of a metal component (e.g., Cu) rather than an etch stop function. In some example embodiments, the first and second insulating barriers 165' and 175' may include materials similar to those of the insulating protective layers 166 and 176, respectively. For example, the first and second insulating barriers 165' and 175' may include silicon nitride, silicon carbide, silicon oxynitride, or silicon carbonitride.

The conductive barrier layer 192' may have a contact expansion element 192F" extending to a side surface of the via contact VC and contacting a side surface of an upper region of the via contact VC. A first insulating layer 171 may have an extended recess region RE around an upper region of the via contact VC. In some example embodiments, unlike other example embodiments, the interconnection electrode 195' extends downwardly along the contact expansion element 192F", and the extended portion of the interconnection electrode 195' may overlap an upper region of the via contact VC in a direction parallel to the upper surface of the substrate.

In the interconnection structure employed in example embodiments, similar to example embodiments illustrated in FIG. 8, a side insulating layer in contact with the via contact VC may be omitted. Since selectivity of the second insulating barrier 175' with the first insulating layer 171 is not high, the side insulating layer may also be partially removed together with a partial region of the first insulating layer 171 in the process (see FIG. 10B) of removing the second insulating barrier 175' region exposed to the trench.

Figure 10A:
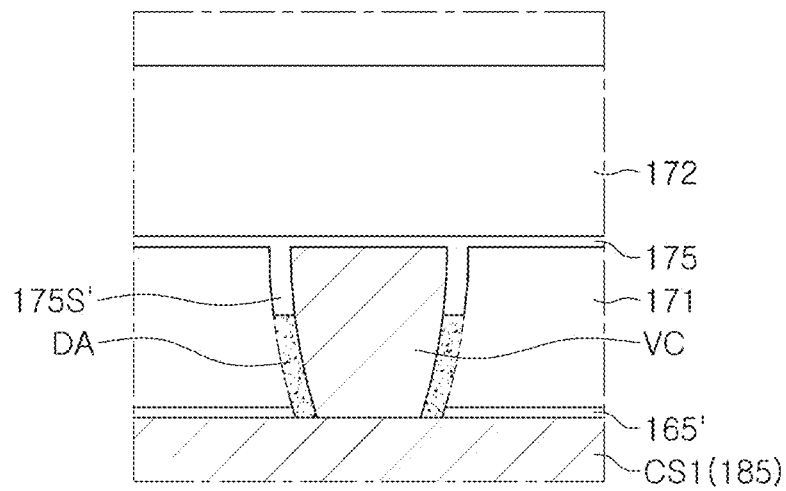
FIGS. 10A to 10C are cross-sectional views for respective main processes to describe a method of manufacturing the semiconductor device illustrated in FIG. 9.
Figure 10B:
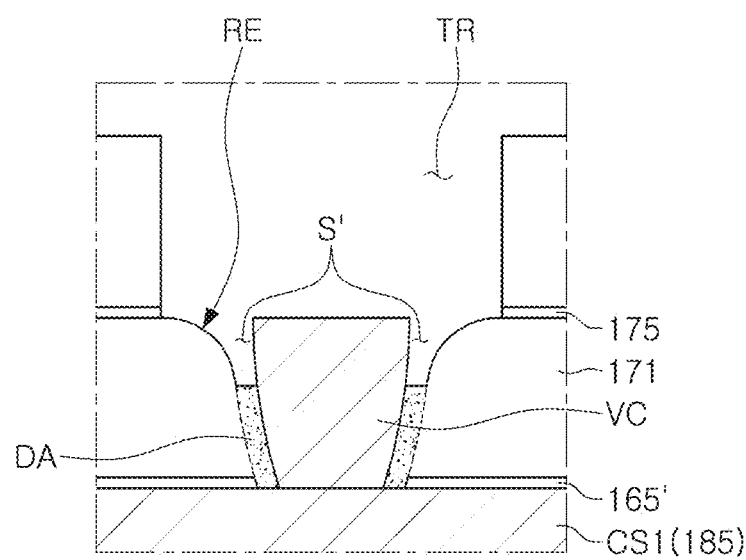
Figure 10C:
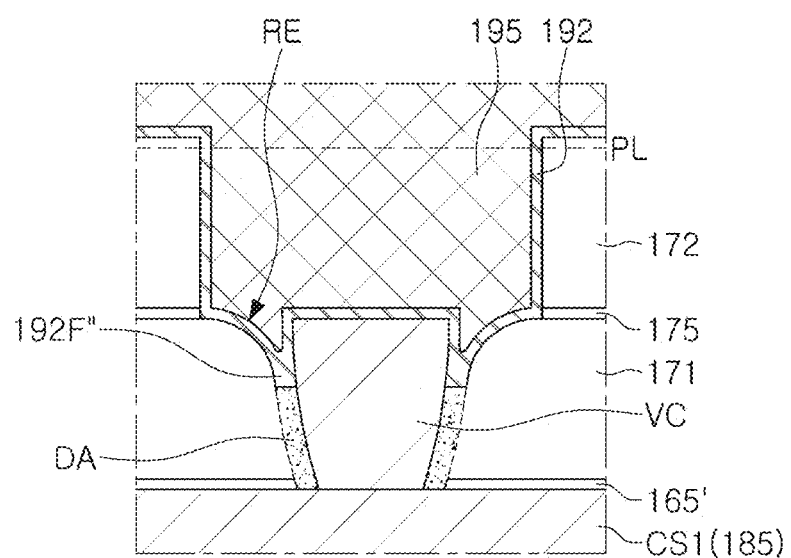

FIGS. 10A to 10C are cross-sectional views for respective main processes illustrating a method of manufacturing the semiconductor device illustrated in FIG. 9.

First, referring to FIG. 10A, the process of FIG. 10A may be understood as a process corresponding to FIG. 4C. After the via contact VC is formed in the via hole VH, the damaged region DA is removed, and the second insulating barrier 175' and the second insulating layer 172 may be sequentially formed on the first insulating layer 171. The second insulating barrier 175' may be filled in the space from which the damaged region DA has been removed, thereby forming the side insulating portion 175S'.

Next, referring to FIG. 10B, a trench TR is formed in the second insulating layer 172, and a portion of the second insulating barrier 175' exposed by the trench TR and a portion of the side insulating portion 175S' may be removed. The second insulating barrier 175' exposed by the trench TR may be removed. As described above, the second insulating barrier 175' does not have a high selectivity with the first insulating layer 171, and thus, as illustrated in FIG. 10B, the region of the first insulating layer 171 positioned around the upper region of the via contact VC may be removed, thereby forming a recess region RE having a relatively wide width. In this process, the side insulating portion 175S' may also be almost completely removed. In this manner, a sufficient space S' of the via contact VC may be secured by the extended recess region RE.

Next, referring to FIG. 10C, a conductive barrier layer 192' is formed in the trench TR, and a second conductive material is filled on the conductive barrier layer 192' in the trench TR, thereby forming an interconnection electrode 195'. The contact expansion element sufficiently filled in the space S' may sufficiently lower the contact resistance. The interconnection structure illustrated in FIG. 9 may be manufactured by performing a CMP process at a predetermined or alternatively, desired level PL to be exposed to the upper surface of the second insulating layer 175 in a subsequent process.

The above-described interconnection structure may be usefully applied to other types of semiconductor devices. For example, although a fin-type transistor (FinFET) including a fin-type channel region is illustrated as illustrated in FIG. 2 as a semiconductor device according to example embodiments, the present inventive concepts are not limited thereto. Examples of a semiconductor device according to some example embodiments may include a tunneling field effect transistor (tunneling FET), a transistor including a nanowire, a transistor (e.g., Multi Bridge Channel FET (MBCFET®)) including a nanosheet, or various three-dimensional (3D) transistors.

Figure 11:
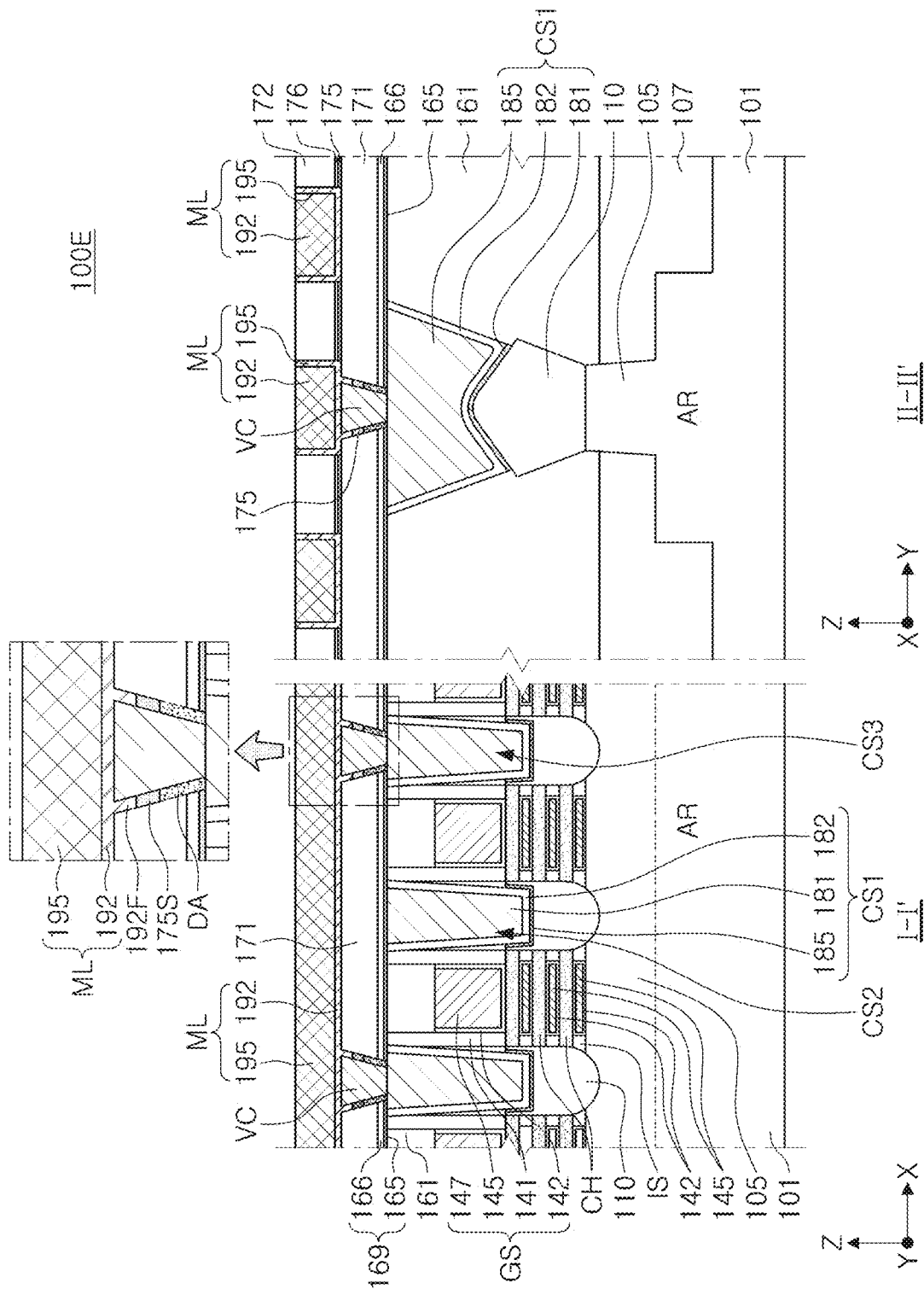
FIG. 11 is a cross-sectional view illustrating a semiconductor device according to example embodiments.

FIG. 11 illustrates cross-sectional views illustrating a semiconductor device according to example embodiments.

Referring to FIG. 11, it can be understood that a semiconductor device 100E is similar to that of example embodiments illustrated in FIGS. 1 and 2, except for being implemented as a multi-channel structure using a plurality of nanosheets and employing one active fin 105' instead of three active fins 105. In addition, the components of example embodiments may be understood with reference to the descriptions of the same or similar components to example embodiments illustrated in FIGS. 1 and 2, unless otherwise specified.

As illustrated in FIG. 11, the semiconductor device 100E may include a plurality of channel layers CH which are spaced apart from each other in a direction (e.g., in the Z direction) perpendicular to the upper surface of the substrate 101, on the active region AR, and which each have a nanosheet structure, and a gate electrode 145 that surrounds the plurality of channel layers CH and extends in a second direction (e.g., Y-direction) intersecting the first direction (e.g., X-direction). As described above, the gate electrode 145 employed in example embodiments may be formed to be interposed between the plurality of channel layers CH as well as between the gate spacers 141.

The semiconductor device 100E may include source/drain regions 110 disposed in the active region AR located on both sides of the gate electrode 145 and connected to the plurality of channel layers CH. In example embodiments, the source/drain regions 110 are disposed in the active region 105 positioned on both sides of the gate electrode 145, and may be respectively connected to both sides of the plurality of channel layers CH disposed in a first direction (e.g., X-direction). In some example embodiments, the number of the channel layers CH is exemplified as three, but the number thereof is not particularly limited. The channel layers CH may be formed of semiconductor patterns. For example, the semiconductor patterns may include at least one of silicon (Si), silicon germanium (SiGe), and germanium (Ge).

The source/drain region 110 may include an epitaxial layer formed by using the plurality of channel layers CH and the active region AR as seeds. The source/drain region 110 may include at least one of silicon germanium (SiGe), silicon (Si), and silicon carbide (SiC).

Inner spacers IS may be provided between each of the source/drain regions 110 and the gate electrode 145. The inner spacers IS may be provided on one side of the gate electrode 145. The inner spacers IS and the channel layers CH may be alternately positioned in the direction perpendicular to the upper surface of the substrate 101. Each of the source/drain regions 110 may contact the channel layer CH and may be spaced apart from the gate electrode 145 with the inner spacers IS interposed therebetween. The gate dielectric layer 142 may be interposed between the gate electrode 145 and each of the channel layers CH, and may extend between the gate electrode 145 and each of the inner spacers IS.

Also, in some example embodiments, the via contacts VC may be disposed in the first insulating layer 171 and may be respectively connected to the first and third contact structures CS1 and CS3. Also, the interconnection lines ML may be disposed in the second insulating layer 172 and may be configured to be electrically connected to the via contact VC.

The conductive barrier layer 192 may have a portion 192F extending to a partial region of a side surface of the via contact VC. Since the contact area with the via contact VC is expanded by the extended portion 192F of the conductive barrier layer 192, substantial contact resistance may be significantly reduced. The length of the extended portion 192F of the conductive barrier layer 192 may be in the range of 5% to 40% of the total height H of the via contact VC. For example, the length of the extended portion 192F may be in the range of 3 nm to 20 nm, and in a detailed example, may be in the range of 5 nm to 15 nm.

A side insulating layer 175S may be disposed on the side region of the via contact VC below the extended portion 192F of the conductive barrier layer 192. The side insulating layer 175S may include the same material as the second etch stop layer 175. In some example embodiments, the side insulating layer 175S may include an aluminum-containing compound. In addition, the first insulating layer 171 may include the damaged region DA in contact with the side surface region of the via contact VC, below the side insulating layer 175S. The damaged region DA may have a carbon content lower than that of other regions of the first insulating layer 171 and/or may have an oxygen content higher than that of other regions of the first insulating layer 171. In some example embodiments, the first insulating layer 171 may include SiOC or SiCOH, and the damaged region DA may include silicon oxide ($SiO_x$). The width of the damaged region DA may be 10 nm or less, and in some example embodiments, may be in the range of 2 nm to 5 nm. A thickness of the side insulating layer 175S and a thickness of the extended portion 192F may be similar to the width of the damaged region DA.

The interconnection structure according to example embodiments may be similarly applied not only to the interconnection structure directly connected to the contact structure, but also to the connection between interconnection structures in the BEOL.

Figure 12:
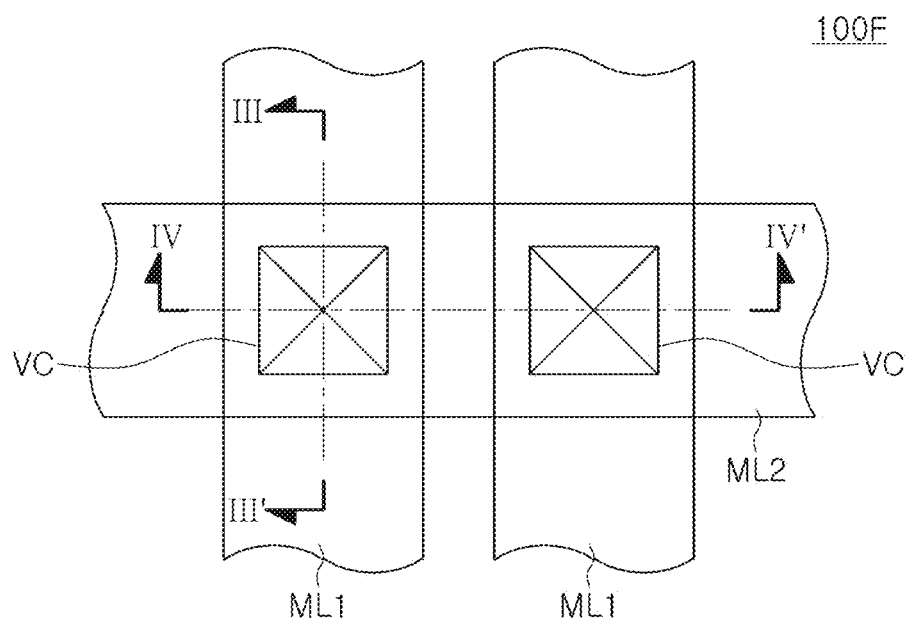
FIG. 12 is a schematic layout of an interconnection structure of a semiconductor device according to example embodiments.
Figure 13A:
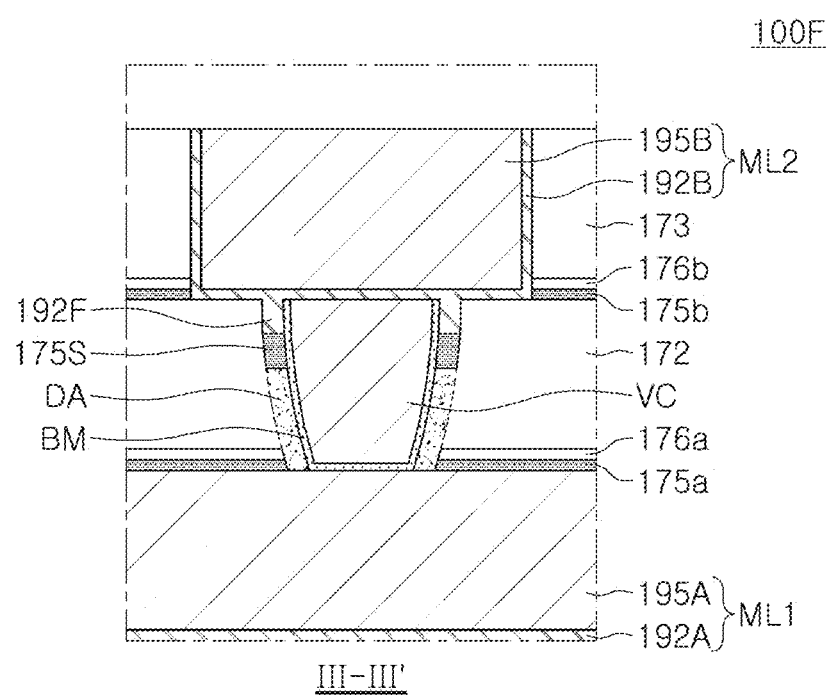
FIGS. 13A and 13B are cross-sectional views taken along lines and IV-IV' of a semiconductor device according to example embodiments.
Figure 13B:
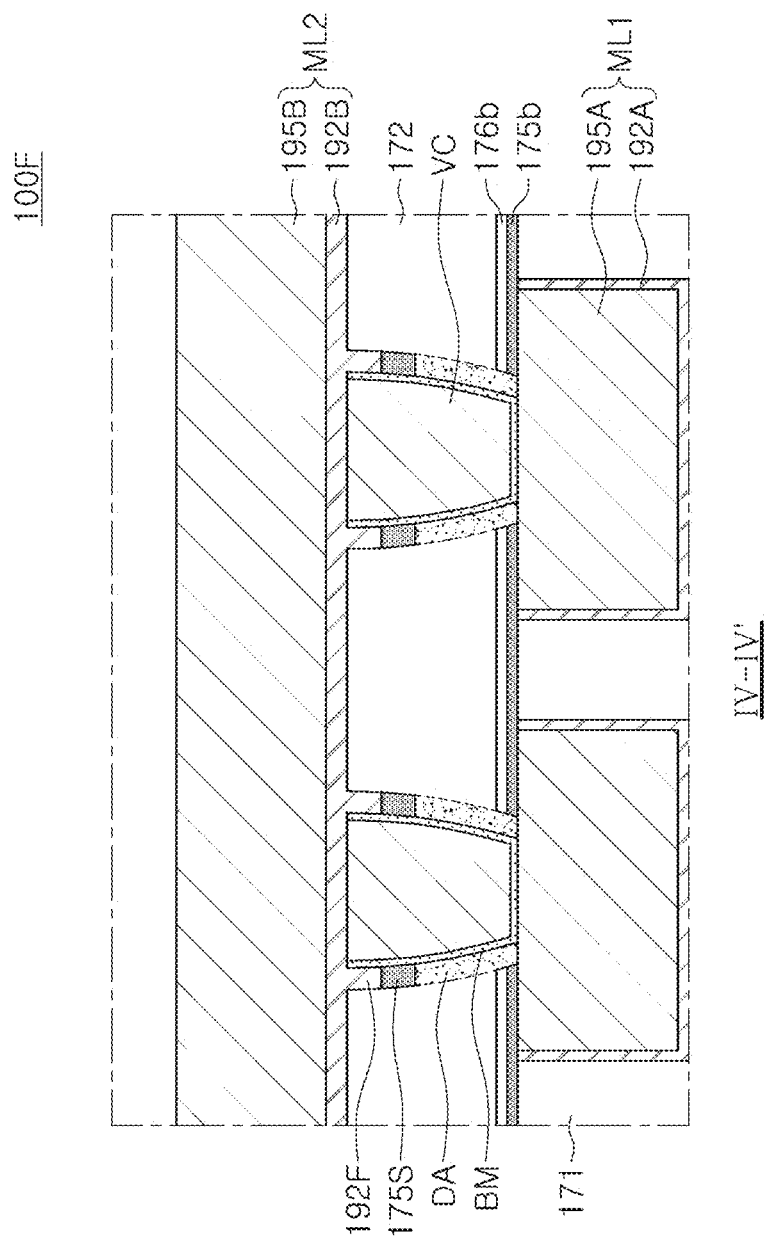

FIG. 12 is a schematic layout of an interconnection structure of a semiconductor device according to example embodiments, and FIGS. 13A and 13B are cross-sectional views taken along lines and IV-IV' of a semiconductor device according to example embodiments, respectively.

Referring to FIG. 12, a semiconductor device 100F according to example embodiments includes first interconnection lines ML1 extending in a first direction, a second interconnection line ML2 extending in a second direction to intersect the first interconnection lines, and a via contact VC connecting each of the first interconnection lines ML1 to the second interconnection line ML2. In some example embodiments, a portion of the first and second interconnection lines ML1 and ML2 may be replaced with an island type pad structure.

Referring to FIGS. 13A and 13B together with FIG. 12, the interconnection structure includes a first insulating layer, a second insulating layer, and a third insulating layer 171, 172 and 173 sequentially stacked. The first to third insulating layers 171, 172, and 173 may include a material having a low dielectric constant (e.g., 3.3 or less). For example, the first to third insulating layers 171, 172, and 173 may include silicon oxide doped with fluorine, such as SiOF, silicon oxide doped with carbon, such as SiOCH, porous silicon oxide, inorganic polymer such as HSSQ, MSSQ or the like, or a spin on organic polymer.

A first etch stop layer 175a and a first insulating protective layer 176a are sequentially disposed between the first and second insulating layers 171 and 172, and a second etch stop layer 175b and a second insulating protective layer 176b may be sequentially disposed between the second and third insulating layers 172 and 173. For example, the first and second etch stop layers 175a and 175b may include aluminum nitride (AlN), aluminum oxynitride (AlON), aluminum oxide (AlO), or aluminum oxide carbide (AlOC). For example, the first and second insulating protective layers 176a and 176b may include silicon nitride, silicon carbide, silicon oxynitride, or silicon carbonitride.

In example embodiments, the first interconnection lines ML1 are disposed in the first insulating layer 171, the second interconnection line ML2 is disposed in the third insulating layer 173, and the first and second interconnection lines ML1 and ML2 are connected by a via contact VC disposed in the third insulating layer 173. The via contacts VC and the second interconnection line ML2 may be formed by a single damascene process, each of which is formed by a separate process.

In detail, each of the first interconnection lines ML1 includes a first interconnection electrode 195A positioned below the via contact VC in the first insulating layer 171, and a second conductive barrier layer 192A disposed on a side surface and a lower surface of the first interconnection electrode 19A5. Similarly, the second interconnection line ML2 includes a second interconnection electrode 195B positioned on the via contact VC in the third insulating layer 173, and a second conductive barrier layer 192B disposed on side and lower surfaces of the second interconnection electrode 195B. In example embodiments, the conductive barrier layer BM may also be disposed on the side surface and the lower surface of the via contact VC. For example, at least one of the via contact VC and the first and second interconnection electrodes 195a and 195b may include Cu, Co, Mo, Ru, or W. For example, the conductive barrier layers 192A, 192B, and BM may include Ta, TaN, Mn, MnN, WN, Ti, or TiN.

As illustrated in FIGS. 13A and 13B, the second conductive barrier layer 192 may include a portion 192F extending to a partial region of a side surface of the via contact VC, for example, may include a contact expansion element. Although not limited, the length of the contact expansion element 192F of the second conductive barrier layer 192B may range from 5% to 40% of the total height of the via contact VC. For example, the length of the contact expansion element 192F may be in the range of 3 nm to 20 nm, and in a detailed example, may be in the range of 5 nm to 15 nm.

A side insulating layer 175S may be disposed on the side area of the via contact VC below the contact expansion element 192F. The side insulating layer 175S may include the same material as the second etch stop layer 175b. In some example embodiments, the side insulating layer 175S may include an aluminum-containing compound. For example, the side insulating layer 175S may include aluminum nitride (AlN), aluminum oxynitride (AlON), aluminum oxide (AlO), or aluminum oxide carbide (AlOC). The length of the side insulating layer 171S may be 30% or less of the total height of the via contact VC, but is not limited thereto. For example, the length of the side insulating layer 175S may be 10 nm or less.

The second insulating layer 172 may include a damaged region DA in contact with a side area of the via contact VC below the side insulating layer 175S. The damaged region DA may have a carbon content lower than that of other regions of the second insulating layer 172, and/or may have an oxygen content higher than that of other regions of the first insulating layer 171. In some example embodiments, the first insulating layer 171 may include SiOC or SiCOH, and the damaged region DA may include silicon oxide (SiO$_x$).

The width of the damaged region DA may be 10 nm or less, and in some example embodiments, may be in the range of 2 nm to 5 nm. A thickness of the side insulating layer 175S and a thickness of the extended portion 192F may be similar to a width of the damaged region DA.

As described above, the expansion of the contact area using the second conductive barrier layer 192B may be implemented by partially recessing the damaged region DA of the second insulating layer 172 adjacent to the side surface of the via contact VC. A contact expansion element 192F is formed by filling a material of the second conductive barrier layer 192B in a recessed space adjacent to a side surface of the via contact VC, thereby increasing the area of contact between the via contact VC and the second interconnection line ML2, and as a result, significantly reducing the contact resistance.

As set forth above, according to example embodiments, by partially recessing the damaged region of the insulating layer adjacent to the side of the via contact and filling the recessed space with a conductive barrier layer, the contact area between the via contact and the interconnection line may be increased, thereby significantly reducing the contact resistance.

While example embodiments have been illustrated and described above, it will be apparent to those skilled in the art that modifications and variations could be made without departing from the scope of the present inventive concepts as defined by the appended claims.

What is claimed is:

1. A semiconductor device comprising:
   a substrate having an active region;
   a first insulating layer on the substrate;
   a second insulating layer on the first insulating layer;
   an etch stop layer between the first insulating layer and the second insulating layer;
   a via contact in the first insulating layer and electrically connected to the active region;
   an interconnection electrode in the second insulating layer and electrically connected to the via contact;
   a conductive barrier layer on a side surface and a lower surface of the interconnection electrode and having an extension portion extending to a partial region of a side surface of the via contact; and
   a side insulating layer on a side region of the via contact below the extension portion of the conductive barrier layer, the side insulating layer including the same material as a material of the etch stop layer.

2. The semiconductor device of claim 1, wherein the etch stop layer and the side insulating layer include an aluminum-containing compound.

3. The semiconductor device of claim 2, wherein the etch stop layer and the side insulating layer include aluminum nitride (AlN), aluminum oxynitride (AlON), aluminum oxide (AlO), or aluminum oxide carbide (AlOC).

4. The semiconductor device of claim 2, further comprising an insulating protective layer on the etch stop layer and not containing an aluminum element.

5. The semiconductor device of claim 1, wherein the side insulating layer has a void.

6. The semiconductor device of claim 1, wherein the first insulating layer includes a damaged region in contact with the side region of the via contact below the side insulating layer, and
   wherein the damaged region has a carbon content lower than a carbon content of other regions of the first insulating layer.

7. The semiconductor device of claim 6, wherein the damaged region has a width in a range of 2 nm to 5 nm.

8. The semiconductor device of claim 1, wherein the extension portion of the conductive barrier layer has a void.

9. The semiconductor device of claim 1, wherein the extension portion of the conductive barrier layer has a concave upper surface.

10. The semiconductor device of claim 1, wherein a depth from an upper surface of the via contact to a lower end of the side insulating layer is in a range of 5% to 60% of a height of the via contact.

11. The semiconductor device of claim 1, wherein a length of the extension portion of the conductive barrier layer is in a range of 5% to 40% of a height of the via contact.

12. The semiconductor device of claim 1, wherein at least one of the side insulating layer and the extension portion of the conductive barrier layer has a width in a range of 2 nm to 5 nm.

13. The semiconductor device of claim 1, wherein at least one of the via contact and the interconnection electrode includes Cu, Co, Mo, Ru, or W.

14. The semiconductor device of claim 1, wherein the conductive barrier layer includes a plurality of barrier layers.

15. The semiconductor device of claim 1, wherein the conductive barrier layer includes Ta, TaN, Mn, MnN, WN, Ti, or TiN.

16. A semiconductor device comprising:
    a substrate;
    a first insulating layer on the substrate;
    a second insulating layer on the first insulating layer;
    an etch stop layer between the first insulating layer and the second insulating layer;
    a via contact in the first insulating layer;
    an interconnection electrode in the second insulating layer and connected to the via contact; and a conductive barrier layer on a side surface and a lower surface of the interconnection electrode,
    wherein the conductive barrier layer has a contact expansion element extending to a side surface of the via contact and enclosing an upper region of the via contact, and the interconnection electrode does not overlap the side surface of the via contact in a direction horizontal to an upper surface of the substrate.

17. The semiconductor device of claim 16, wherein a length of the contact expansion element in a direction, perpendicular to the upper surface of the substrate, is in a range of 5% to 40% of a height of the via contact.

18. The semiconductor device of claim 16, wherein the first insulating layer includes a damaged region contacting a side region of the via contact below the contact expansion element, and
    wherein the damaged region has an oxygen content higher than an oxygen content of other regions of the first insulating layer.

19. A semiconductor device comprising:
a substrate;
a first insulating layer on the substrate;
a second insulating layer on the first insulating layer;
a via contact in the first insulating layer;
an interconnection electrode in the second insulating layer and connected to the via contact; and
a conductive barrier layer on a side surface and a lower surface of the interconnection electrode,
    wherein the first insulating layer has a damaged region in contact with a side surface of a lower region of the via contact and having a carbon content less than a carbon content of other regions of the first insulating layer, and
    the conductive barrier layer has a contact expansion element extending to a side surface of the via contact and contacting a side surface of an upper region of the via contact.

20. The semiconductor device of claim 19, wherein the interconnection electrode includes a region overlapping the upper region of the via contact in a direction horizontal to an upper surface of the substrate along the contact expansion element.

* * * * *